United States Patent
Resnick

(10) Patent No.: US 8,977,822 B2
(45) Date of Patent: Mar. 10, 2015

(54) MEMORY DEVICE AND METHOD HAVING ON-BOARD PROCESSING LOGIC FOR FACILITATING INTERFACE WITH MULTIPLE PROCESSORS, AND COMPUTER SYSTEM USING SAME

(75) Inventor: David Resnick, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/243,917

(22) Filed: Sep. 23, 2011

(65) Prior Publication Data

US 2012/0023294 A1    Jan. 26, 2012

Related U.S. Application Data

(63) Continuation of application No. 11/893,593, filed on Aug. 15, 2007, now Pat. No. 8,055,852.

(51) Int. Cl.
*G06F 12/00* (2006.01)
*G11C 7/10* (2006.01)

(52) U.S. Cl.
CPC ...... *G11C 7/1006* (2013.01); *G11C 2207/2245* (2013.01)
USPC .............. 711/154; 711/105; 711/104; 711/5; 711/147; 711/118

(58) Field of Classification Search
USPC ...................... 711/105, 154, 104, 5, 147, 118
See application file for complete search history.

(56) References Cited

U.S. PATENT DOCUMENTS

| | | | |
|---|---|---|---|
| 4,787,041 A | 11/1988 | Yount | |
| 4,789,925 A | 12/1988 | Lahti | |
| 4,796,232 A | 1/1989 | House | 365/189 |
| 4,975,878 A | 12/1990 | Boddu et al. | 365/189.07 |
| 5,067,071 A | 11/1991 | Schanin et al. | 395/275 |
| 5,163,139 A | 11/1992 | Haigh et al. | 395/375 |
| 5,420,994 A | 5/1995 | King et al. | |
| 5,457,482 A | 10/1995 | Rhoden et al. | 345/201 |
| 5,488,583 A | 1/1996 | Ong et al. | 365/201 |
| 5,524,225 A | 6/1996 | Kranich | |
| 5,678,021 A | 10/1997 | Pawate et al. | |
| 5,682,344 A | 10/1997 | Seyyedy | |
| 5,737,757 A | 4/1998 | Hassoun et al. | 711/145 |

(Continued)

FOREIGN PATENT DOCUMENTS

EP    0718769    6/1996

OTHER PUBLICATIONS

Fang, et al., "Active Memory Operations", ACM, Jun. 2007, 232-241.

(Continued)

*Primary Examiner* — Mardochee Chery
(74) *Attorney, Agent, or Firm* — Dorsey & Whitney LLP

(57) ABSTRACT

A memory device includes an on-board processing system that facilitates the ability of the memory device to interface with a plurality of processors operating in a parallel processing manner. The processing system includes circuitry that performs processing functions on data stored in the memory device in an indivisible manner. More particularly, the system reads data from a bank of memory cells or cache memory, performs a logic function on the data to produce results data, and writes the results data back to the bank or the cache memory. The logic function may be a Boolean logic function or some other logic function.

19 Claims, 3 Drawing Sheets

(56) References Cited

U.S. PATENT DOCUMENTS

| | | | | |
|---|---|---|---|---|
| 5,802,541 | A | 9/1998 | Reed | 711/1 |
| 5,835,925 | A | 11/1998 | Kessler et al. | |
| 5,907,861 | A | 5/1999 | Seyyedy | |
| 5,978,915 | A | 11/1999 | Lisart | |
| 6,026,478 | A | 2/2000 | Dowling | |
| 6,049,487 | A | 4/2000 | Plants et al. | 365/189.04 |
| 6,081,876 | A | 6/2000 | Brewer et al. | 711/163 |
| 6,321,314 | B1 | 11/2001 | Van Dyke | 711/163 |
| 6,343,346 | B1 | 1/2002 | Olnowich | |
| 6,378,049 | B1 | 4/2002 | Stracovsky et al. | 711/147 |
| 6,563,754 | B1* | 5/2003 | Lien et al. | 365/222 |
| 6,611,904 | B1 | 8/2003 | Uguen | |
| 6,868,019 | B2 | 3/2005 | Mohr et al. | |
| 7,174,429 | B2 | 2/2007 | Revilla et al. | |
| 7,203,791 | B2 | 4/2007 | Lee et al. | |
| 7,320,100 | B2 | 1/2008 | Dixon et al. | 714/758 |
| 7,421,564 | B1 | 9/2008 | Rahim et al. | 711/219 |
| 7,565,593 | B2 | 7/2009 | Dixon et al. | 714/754 |
| 7,574,576 | B2 | 8/2009 | Kato et al. | |
| 7,676,728 | B2 | 3/2010 | Resnick et al. | 714/764 |
| 2003/0018860 | A1 | 1/2003 | Krueger | 711/152 |
| 2003/0056143 | A1 | 3/2003 | Prabhu | |
| 2003/0221091 | A1* | 11/2003 | Henry et al. | 712/244 |
| 2004/0093458 | A1 | 5/2004 | Kanno et al. | |
| 2004/0093467 | A1 | 5/2004 | Shen et al. | 711/141 |
| 2004/0193837 | A1 | 9/2004 | Devaney | |
| 2004/0202034 | A1 | 10/2004 | Lee | |
| 2005/0022065 | A1 | 1/2005 | Dixon et al. | 714/42 |
| 2005/0097276 | A1 | 5/2005 | Lu et al. | 711/118 |
| 2005/0144375 | A1 | 6/2005 | Bains et al. | 711/105 |
| 2005/0207257 | A1 | 9/2005 | Skidmore | 365/230.01 |
| 2005/0219901 | A1 | 10/2005 | Gilton | |
| 2006/0047886 | A1 | 3/2006 | Leaback | 711/5 |
| 2006/0190671 | A1 | 8/2006 | Jeddeloh | 711/105 |
| 2006/0274577 | A1 | 12/2006 | Pascucci et al. | |
| 2007/0067556 | A1 | 3/2007 | Dixon et al. | 711/106 |
| 2007/0091707 | A1 | 4/2007 | Hidaka | |
| 2007/0101238 | A1 | 5/2007 | Resnick et al. | 714/763 |
| 2007/0113150 | A1 | 5/2007 | Resnick et al. | 714/763 |
| 2007/0150671 | A1 | 6/2007 | Kurland | |
| 2008/0155217 | A1 | 6/2008 | Kato et al. | |
| 2008/0183984 | A1 | 7/2008 | Beucler et al. | |
| 2008/0189557 | A1 | 8/2008 | Pipitone et al. | |
| 2009/0006800 | A1 | 1/2009 | Bellofatto et al. | |
| 2009/0049245 | A1 | 2/2009 | Resnick | 711/118 |
| 2009/0049250 | A1 | 2/2009 | Resnick | |
| 2009/0049264 | A1 | 2/2009 | Resnick | 711/163 |
| 2009/0138675 | A1 | 5/2009 | Marr et al. | |
| 2009/0138680 | A1 | 5/2009 | Johnson et al. | |
| 2009/0138687 | A1* | 5/2009 | Kang | 712/225 |
| 2011/0029712 | A1 | 2/2011 | Resnick | 711/5 |
| 2011/0119467 | A1 | 5/2011 | Cadambi et al. | |
| 2011/0191548 | A1 | 8/2011 | Miller et al. | |
| 2013/0013876 | A1 | 1/2013 | Resnick | |

OTHER PUBLICATIONS

First Office Action received for TW application No. 097130579.
"IEEE 100 The Authoritative Dictionary of IEEE Standard Terms", IEEE, Seventh Ed., Dec. 2000, pp. 787-788.
TW Office Action for Taiwan Application No. 097130579 issued Apr. 3, 2013 (with English translation).
International Search Report and Written Opinion for International Application No. PCT/US2008/072809 mailed Feb. 26, 2009.
Office Action of the Intellectual Property Office (Translation) for TW Appl. No. 097130579 issued Oct. 15, 2014.

* cited by examiner

MEMORY DEVICE AND METHOD HAVING ON-BOARD PROCESSING LOGIC FOR FACILITATING INTERFACE WITH MULTIPLE PROCESSORS, AND COMPUTER SYSTEM USING SAME

CROSS-REFERENCE TO RELATED APPLICATION

This application is a continuation of U.S. patent application Ser. No. 11/893,593, filed Aug. 15, 2007, U.S. Pat. No. 8,055,852. This application and patent are incorporated by reference herein in their entirety and for all purposes.

TECHNICAL FIELD

This invention relates generally to memory devices, and, more particularly, to a memory device and method that facilitates access by multiple memory access devices, as well as memory systems and computer systems using the memory devices.

BACKGROUND

As computer and computer system architecture continues to evolve, the number of processing cores and threads within cores is increasing geometrically. This geometric increase is expected to continue, even for simple, relatively inexpensive computer systemS. For server systems, system sizes measured in the number of processors are increasing at an even faster rate.

Although this rapid increase in the number of cores and threads enhances the performance of computer systems, it also has the effect of making it difficult to apply the increasing parallelism to single applications. This limitation exists even for high-end processing tasks that naturally lend themselves to parallel processing, such as, for example, weather prediction. One of the major reasons for this limitation is that the number of communication paths between processors, cores, and threads increases disproportionately to the number of times the task is divided into smaller and smaller pieces. Conceptually, this problem can be analogized to the size of a processing being represented by the volume of a 3D cube. Each time this volume is divided into smaller cubes, the total surface area of the cubes, which represents data that must be communicated between the processors working on sub-cubes, increases. Every time that the number of processors goes up by a factor of eight the total amount of information to be communicated between the greater number of processors doubles.

One reason for these problems caused by increasing parallelism is that most systems communicate by sending messages between processors, rather than sharing memory. This approach results in high latencies and high software overheads, although it may simplify some complex system architecture, operating system, and compiler issues. Unfortunately, as the level of parallelism increases, the processors in the system reach the point where all they are doing is managing message traffic rather than actually doing useful work.

There is therefore a need for a system and method that can reduce software overhead and eliminate or at least reduce performance bottlenecks thereby improving system performance and architectural scalability at relatively low cost.

DETAILED DESCRIPTION

Figure 1:
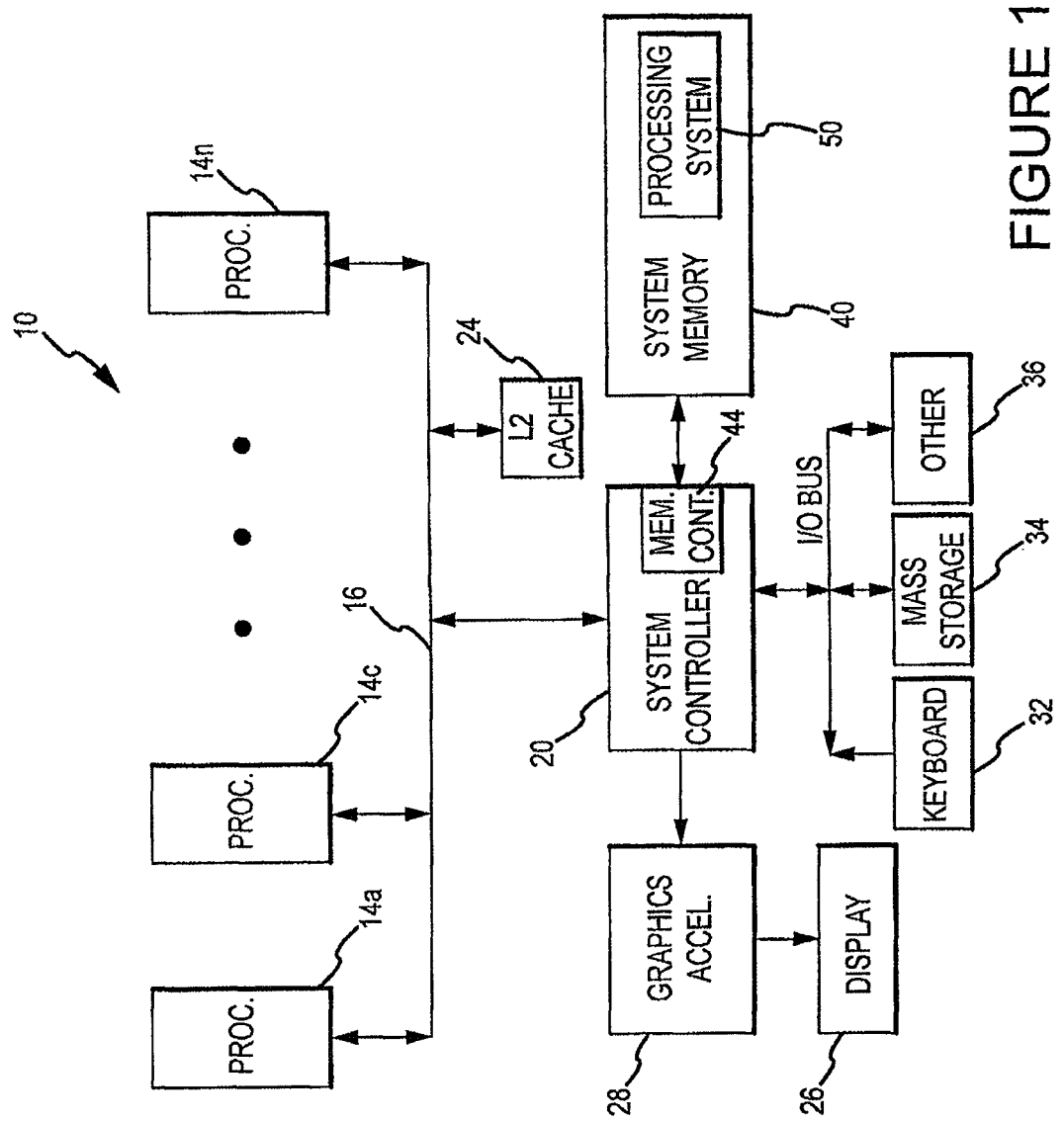
FIG. 1 is a block diagram of a computer system according to one embodiment.

A computer system 10 according to one embodiment is shown in FIG. 1. The computer system 10 includes several parallel processors $14_{1-N}$ connected to a common processor bus 16. Also connected to the processor bus 16 are a system controller 20 and a level 2 ("L2") cache 24. As is well known in the art, each of the processors $14_{1-N}$ may include a level 1 ("L1") cache.

The system controller 20 drives a display 26 through a graphics accelerator 28, which may include a graphics processor and graphics memory of conventional design. Also connected to the system controller 20 is an input/output ("I/O") bus 30, such as a peripheral component interconnect ("PCI") bus, to which are connected a keyboard 32, a mass storage device 34, such as a hard disk drive, and other peripheral devices 36. Of course there can also be systems such as servers, that do not have directly connected keyboard, graphics or display capabilities, for example.

The computer system 10 also includes system memory 40, which may be a dynamic random access memory ("DRAM") device or sets of such devices. The system memory 40 is controlled by memory controller circuitry 44 in the system controller 20 through a memory bus 46, which normally includes a command/status bus, an address bus and a data bus. There are also systems in which the system and memory controller is implemented directly within a processor IC. As described so far, the computer system 10 is conventional. However, the system memory 40 departs from conventional systems by including in the system memory 40 a processing system 50 that enhancers the ability of the parallel processors $14_{1-N}$ to access the system memory 40 in an efficient manner. It should also be understood that the system 50 may be used in memory devices in a computer or other processor-based systems that differ from the computer system 10 shown in FIG. 1. For example, servers and other high-end systems will generally not include the graphics accelerator 28, the display 26, the keyboard 32, etc., but will have disk systems or simply connect to a network of other similar processors with attached memory.

The processing system 50 includes circuitry that allows the system memory 40 to be naturally coherent by carrying out operations in the memory device an indivisible manner. The system reduces or eliminates coherency issues and may improve communication for all levels in the computer system 10. The processing system 50 or a processing system according to some other embodiment can be implemented in the system memory 40 while keeping the internal organization of the memory system substantially the same as in conventional system memories. For example, bank timing and memory data rates can be substantially the same. Further, the system 50 need not be particularly fast as the operations needed are generally simple and fit with current and anticipated memory clock rates.

In general, it is preferable for the processing to be initiated and to be performed as a single indivisible operation. An example is where a byte in a 32-bit word is updated (read and then written) while preventing access to the word while the update is being executed. Functions like these, which are sometime referred to as "atomic," are desired when parallel processes access and update shared data. The processing system 50 allows the system memory 40 to be naturally coherent by performing operations as an indivisible whole with a single access. The coherency circuitry reduces or eliminates coherency issues and may improve communication for all levels in the computer system 10. The coherency circuitry operates most advantageously when used with other extensions to the functionality of memory devices, such as that provided by a cache system.

Figure 2:
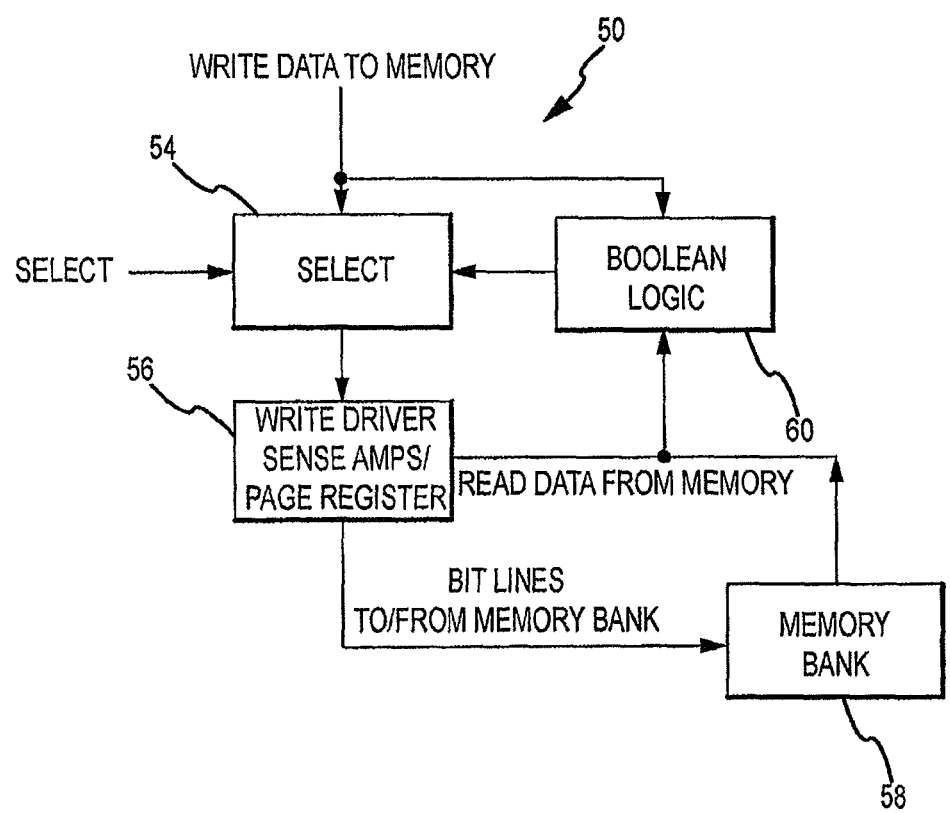
FIG. 2 is block diagram of a portion of a system memory device containing processing logic according to one embodiment that may be used in the computer system of FIG. 1 to allow operations to be carried out in the memory device in an indivisible manner.

One embodiment of a processing system 50 is shown in FIG. 2. The system 50 includes a select circuit 54, which may be a multiplexer, that routes write data to a column of a Memory Bank 58 through a set of write drivers 56. The write data are routed to the column from either a data bus of the memory device 40 or Boolean Logic 60. The Boolean Logic 60 receives read data from a set of sense amplifiers and page registers 56. The read data are also applied to the data bus of the memory device 40.

In operation, the select circuit 54 normally couples write data directly to the write drivers 56 of the Bank 58 However, in response to a command from the memory controller 44, the select circuit 54 routes data from the Boolean Logic 60 to the write drivers 56. In response to a read command, the read data are applied to the Boolean Logic 60, and the Boolean Logic 60 then performs a Boolean logic operation on the read data and writes data resulting from the operation back to the location in the Bank 58 where the data was read. If the memory device 40 includes a cache memory, the Boolean Logic 60 can instead perform an operation on data read from the cache memory before writing the result data back to the same location in the cache memory.

Although the system 50 shown in FIG. 6 uses Boolean Logic 60, other embodiments may use circuits or logic that perform other increased functions. In general, this increased functionality may be logic functions, such as AND, OR, etc. functions, arithmetic operations, such as ADD and SUB, and similar operations that can update and change the contents of memory. Arithmetic functions would be very useful to multiple different kinds of software. However, as indicated above, the system 150 performs Boolean logic operations since they are also very useful functions to implement as flags and for general communication between computation threads, cores, and clusters. A Boolean operation is a standalone bit-operation since no communication between bits participating in the operation is generally required, and can be implemented efficiently on a memory die. As each Boolean operation is simple, the logic implementing the functions does not have to be fast compared to the memory clock. These functions provide coherency directly as memory is modified in the memory device. These functions, in conjunction with the protection capability described previously, enable system implementation of a set of easy to use but novel memory functions.

Typical logical functions that may be implemented by the Boolean Logic 60 are shown in Table 1, below. The increased functionality can provide solutions to many of the issues that surround the increased parallelism of new computer implementations.

The basic operation that is performed to implement the logic functions is: WriteData .OP. MemData→MemData where ".OP." is a value designating a specified Boolean logic function. Memory data is modified by data contained in what is basically a Write operation, with the result returned to the same place in memory that sourced the data. An on-chip data cache can be source and/or sink of the data that is operated on by the Boolean Logic 160. If the data source is a memory bank rather than a cache memory, an Activate to a bank specified in the command should also be issued, with the page data loaded into the normal row buffer. Write data accompanying the command is then applied to the row buffer at the specified column addresses. The result is written back to memory, though this could be under control of a Precharge bit in the Boolean logic 60. The operation is thus a Write, but with memory data itself modifying what is written back to memory. If the data source is a cache memory, then a cache row is fetched, such as by using tag bits as described previously. After the data read from the cache memory is transformed by the logic operation, the result data are stored at the same location in the cache memory.

In operation, there may be multiple different kinds of OPs, so as to enable memory bits to be set, cleared and complemented. As detailed below, this write-up shows eight different operations. A particular set of command bits are not shown here to encode the particular Boolean logic function because the implementation can be independent of the cache memory operations described previously. If combined with the use of a cache memory, a cache reference command as described above may be used. This cache reference command may be encoded using a respective set of RAS, CAS, WE, DM command signals. A set of commands is shown in Table 1, below. The manner in which those command bits map to DRAM command bits my be defined in a variety of manners. However, one embodiment of a set of instructions and an instruction mapping is shown in Table 1 in which "W" designates a write bit received by the memory device, "M" designates a bit of data read from either a bank of memory cells or the cache memory, "•" is an AND function, "+" is an OR function, and "⊕" is an exclusive OR function.

Figure 3:
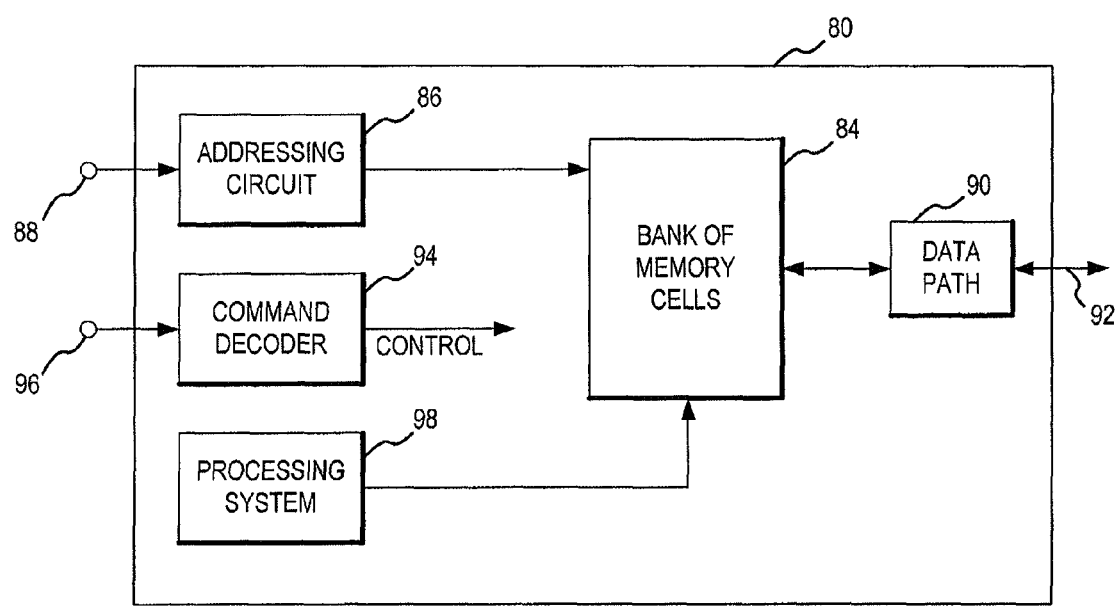
FIG. 3 is a block diagram of a memory device according to one embodiment that may be used in the computer system of FIG. 1.

FIG. 3 shows one embodiment of a memory device 80. The memory device 80 includes at least one bank of memory cells 84 coupled to an addressing circuit 86 that is coupled between external terminals 88 and the at least one bank of memory cells 84. The memory device 80 also includes a data path 90 coupled between 92 external terminals and the at least one bank of memory cells 84. Also included in the memory device 80 is a command decoder 94 coupled to external terminals 96. The command decoder 94 is operable to generate control signals to control the operation of the memory device 80. Finally, the memory device 80 includes a processing system 98 coupled to the at least one bank of memory cells 84. The processing system is operable to perform a processing function on data read from the at least one bank of memory cells 84 to provide results data and to write the results data to the at least one bank of memory cells 84. The processing system 50 shown in FIG. 2 may be used as the processing system 98, or some other embodiment of a processing system may be used as the processing system 98.

TABLE 2

Boolean Functions

| OP Code (octal) | Primary Equation | Alternate Equation | Common Name | Operation |
|---|---|---|---|---|
| 0 | W • M | | AND | Clear on 0's |
| 1 | $\overline{W}$ • M | | | Clear on 1's |
| 2 | W ⊕ M | | XOR | Complement on 1's |
| 3 | $\overline{W \cdot M}$ | $\overline{W} + \overline{M}$ | NOR | NOR |
| 4 | $\overline{W} \cdot \overline{M}$ | $\overline{W + M}$ | NAND | NAND |

TABLE 2-continued

Boolean Functions

| OP Code (octal) | Primary Equation | Alternate Equation | Common Name | Operation |
|---|---|---|---|---|
| 5 | $\overline{W \oplus M}$ | | EQV | Complement on 0's |
| 6 | $\overline{W} \cdot \overline{M}$ | $\overline{W} + M$ | | Set on 0's |
| 7 | $\overline{W \cdot M}$ | $\overline{W} + \overline{M}$ | OR | Set on 1's |

Notes:
1 "W" is a write bit coming from the input pins.
2 "M" is a memory bit
3 "·" is AND
4 "+" is OR
5 "⊕" is Exclusive OR From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. In an integrated circuit memory device, a method of enhancing an ability of the memory device to interface with a parallel processor, the method performed within the integrated circuit memory device, the method comprising:
   receiving, by a processing system within the memory device, an external command to perform an indivisible operation in the memory device;
   responsive to the external command to perform the indivisible operation, reading, by the processing system within the memory device, data from a first location in at least one bank of memory cells within the memory device;
   performing, by the processing system within the memory device, a logic function on the data read from the first location in the at least one bank of memory cells based, at least in part, on the command, wherein the processing system within the memory device generates results data;
   writing, by the processing system within the memory device, the results data to the same first location in the at least one bank of memory cells from which the data was read; and
   preventing, by the processing system within the memory device, access to the data read from the same first location in the at least one bank of memory cells while the data are being read, the processing function is being performed, and the results data are being written.

2. The method of claim 1 wherein the act of reading data from a first location comprises routing data from the first location to Boolean logic.

3. The method of claim 1, wherein the act of performing, by a processing system within the memory device, a logic function on the data read from the at least one bank of memory cells comprises performing, by the processing system within the memory device, a Boolean logic function on the data read from the at least one bank of memory cells.

4. The method of claim 1 wherein the integrated circuit memory device further comprises a cache memory, and wherein the method further comprises:
   reading, by the processing system within the memory device, data from the cache memory;
   performing, by the processing system within the memory device, a function on the data read from the cache memory to generate results data; and
   writing the results data to the cache memory.

5. The method of claim 1, wherein said writing the results data is performed responsive, at least in part, to receipt of a precharge bit.

6. The method of claim 1, wherein the indivisible operation is performed with a single access.

7. The method of claim 1, wherein the external command is provided by a memory controller.

8. A method, comprising:
   receiving, by a processing system within a memory device, a command to perform an atomic operation;
   reading, by the processing system within the memory device, data from the memory device at an address responsive, at least in part, to receipt of the command;
   performing, by the processing system within the memory device, a processing function on the data read from the address based, at least in part, on the atomic operation to generate results data; and
   writing, by the processing system within the memory device, the results data to the same address.

9. The method of claim 8, wherein the processing function comprises at least one of a logic function or an arithmetic operation.

10. The method of claim 8, wherein the address comprises a cache memory address.

11. The method of claim 10, wherein said performing a processing function comprises:
   fetching a cache row based, at least in part, on a tag bit; and
   transforming the data read to provide results data.

12. The method of claim 8, wherein the processing function is performed as an indivisible whole with a single access.

13. The method of claim 8, wherein the command is received via a network.

14. A method, comprising:
   receiving a command at a processing unit of a memory device to perform an atomic operation;
   receiving write data at the processing unit of the memory device;
   reading, by the processing unit of the memory device, read data at an address in the memory device responsive, at least in part to receipt of the command;
   performing, by the processing unit of the memory device, a Boolean operation on the read data and the write data to generate results data; and
   writing, by the processing unit within a memory device, the results data to the same address.

15. The method of claim 14, wherein the command is a cache reference command.

16. The method of claim 14, wherein the command is provided by a memory controller coupled to the memory device.

17. The method of claim 14, wherein said reading, said performing, and said writing are performed within the memory device in an indivisible manner responsive only to the command.

18. The method of claim 14, wherein the command is received from a parallel processor.

19. The method of claim 14, wherein said performing, by the processing unit of the memory, a Boolean operation on the read data and the write data to generate the results data is based, at least in part, on a precharge bit.

* * * * *